United States Patent
Sung et al.

(10) Patent No.: US 6,936,860 B2
(45) Date of Patent: Aug. 30, 2005

(54) LIGHT EMITTING DIODE HAVING AN INSULATING SUBSTRATE

(75) Inventors: Shu-Wen Sung, Hsin-Chu (TW);
Chin-Fu Ku, Hsin-Chu (TW);
Chia-Cheng Liu, Hsin-Chu (TW);
Min-Hsun Hsieh, Hsin-Chu (TW);
Chao-Nien Huang, Hsin-Chu (TW);
Chen Ou, Hsin-Chu (TW);
Chuan-Ming Chang, Hsin-Chu (TW)

(73) Assignee: Epistar Corporation, Hsin-Chu (TW)

( * ) Notice: Subject to any disclaimer, the term of this patent is extended or adjusted under 35 U.S.C. 154(b) by 0 days.

(21) Appl. No.: 10/063,822

(22) Filed: May 16, 2002

(65) Prior Publication Data

US 2002/0179918 A1 Dec. 5, 2002

(30) Foreign Application Priority Data

May 30, 2001 (TW) .................................. 90113284 A

(51) Int. Cl.$^7$ .......................... H01L 33/00; H01L 29/12
(52) U.S. Cl. ........................... 257/99; 257/13; 257/103; 257/97; 257/79; 257/613; 257/615; 257/46; 257/104; 257/106
(58) Field of Search ................. 257/13, 79, 94, 257/103, 104, 106, 613, 615, 99, 46

(56) References Cited

U.S. PATENT DOCUMENTS

| | | | | |
|---|---|---|---|---|
| 5,889,295 A | * | 3/1999 | Rennie et al. ............. | 257/96 |
| 5,900,650 A | * | 5/1999 | Nitta ........................ | 257/94 |
| 6,020,602 A | * | 2/2000 | Sugawara et al. ......... | 257/103 |
| 6,078,064 A | * | 6/2000 | Ming-Jiunn ............... | 257/103 |
| 6,121,634 A | * | 9/2000 | Saito et al. ............... | 257/86 |
| 6,121,635 A | * | 9/2000 | Watanabe et al. .......... | 257/91 |
| 6,288,416 B1 | * | 9/2001 | Koide et al. .............. | 257/94 |

FOREIGN PATENT DOCUMENTS

| JP | 08-102550 | 4/1996 |
|---|---|---|
| JP | 09-074246 | 3/1997 |

* cited by examiner

*Primary Examiner*—Allan R. Wilson
*Assistant Examiner*—Joseph Nguyen
(74) *Attorney, Agent, or Firm*—Winston Hsu

(57) ABSTRACT

An LED includes an insulating substrate; a buffer layer positioned on the insulating substrate; an $n^+$-type contact layer positioned on the buffer layer, the contact layer having a first surface and a second surface; an n-type cladding layer positioned on the first surface of the $n^+$-type contact layer; a light-emitting layer positioned on the n-type cladding layer; a p-type cladding layer positioned on the light-emitting layer; a p-type contact layer positioned on the p-type cladding layer; an $n^+$-type reverse-tunneling layer positioned on the p-type contact layer; a p-type transparent ohmic contact electrode positioned on the $n^+$-type reverse-tunneling layer; and an n-type transparent ohmic contact electrode positioned on the second surface of the $n^+$-type contact layer. The p-type transparent ohmic contact electrode and the n-type transparent ohmic contact electrode are made of the same materials.

14 Claims, 1 Drawing Sheet

LIGHT EMITTING DIODE HAVING AN INSULATING SUBSTRATE

BACKGROUND OF THE INVENTION

1. Field of the Invention

The present invention relates to a light emitting diode (LED), and more particularly, to a light emitting diode having an insulating substrate.

2. Description of the Prior Art

Light emitting diodes (LEDs) are employed in a wide variety of applications including optical display devices, traffic lights, data storage equipment, communication devices, illumination apparatuses, and medical treatment equipment. One of the main goals of engineers who design LEDs is to increase the brightness of the light emitted from LEDs.

U.S. Pat. No. 5,563,422 discloses a gallium nitride (GaN)-based LED in FIG. 10. The LED has a p-type ohmic contact electrode 56 made of nickel, gold or a nickel-gold alloy. The LED also has an n-type ohmic contact electrode 57 made of titanium, aluminum, or a titanium-aluminum alloy. Since the electrodes 56 and 57 are made of different materials, two evaporation processes and two photolithographic processes are required to form the electrodes 56 and 57, respectively.

SUMMARY OF THE INVENTION

It is an objective of the claimed invention to provide an LED having a p-type ohmic contact electrode and an n-type ohmic contact electrode made of the same materials.

According to the claimed invention, the LED includes an insulating substrate; a buffer layer positioned on the insulating substrate; an n$^+$-type contact layer positioned on the buffer layer, the contact layer having a first surface and a second surface; an n-type cladding layer positioned on the first surface of the n$^+$-type contact layer; a light-emitting layer positioned on the n-type cladding layer; a p-type cladding layer positioned on the light-emitting layer; a p-type contact layer positioned on the p-type cladding layer; an n$^+$-type reverse-tunneling layer positioned on the p-type contact layer; a p-type transparent ohmic contact electrode positioned on the n$^+$-type reverse-tunneling layer; and an n-type transparent ohmic contact electrode positioned on the second surface of the n$^+$-type contact layer. The p-type transparent ohmic contact electrode and the n-type transparent ohmic contact electrode are made of the same materials.

It is an advantage of the claimed invention that the p-type ohmic contact electrode and the n-type ohmic contact electrode are made of the same materials, thus only an evaporation process and a photolithographic process are required for simultaneously forming the p-type ohmic contact electrode and the n-type ohmic contact electrode to reduce the production costs of the LED.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
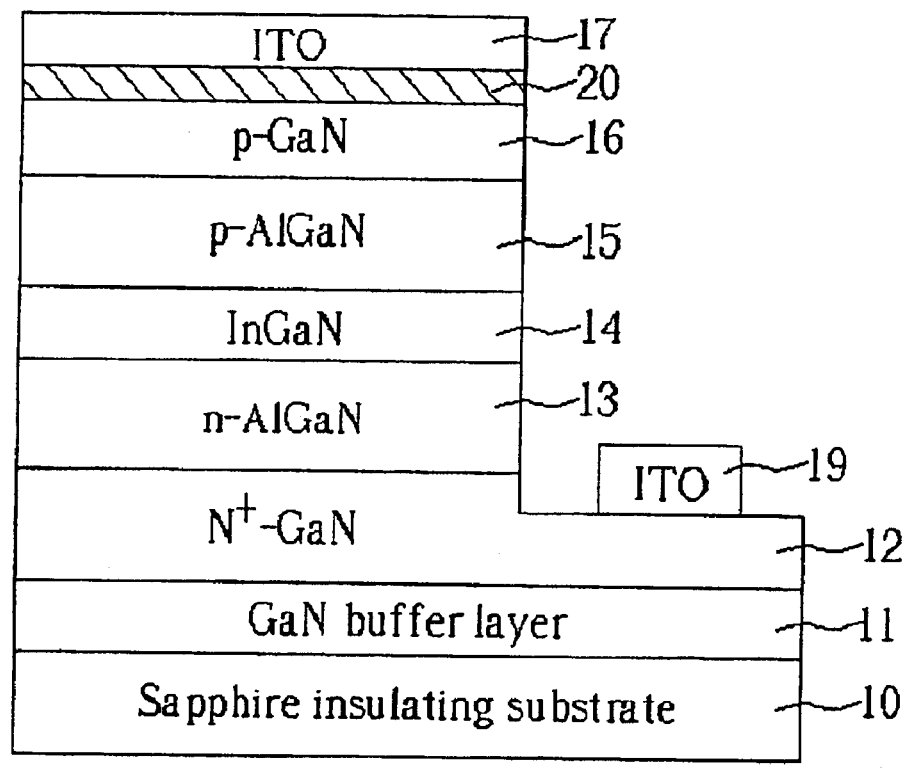
FIG. 1 is a schematic diagram of an LED having an insulating substrate according to a better embodiment of the present invention.

Please refer to FIG. 1 of a schematic diagram of an LED having an insulating substrate according to a better embodiment of the present invention. The LED includes a stacked structure, which is composed of a sapphire insulating substrate 10, a GaN buffer layer 11 positioned on the insulating substrate 10, an n$^+$-type GaN contact layer 12 positioned on the buffer layer 11, an n-type AlGaN cladding layer 13 positioned on the n$^+$-type contact layer 12, an InGaN light-emitting layer 14 with a multiple-quantum well (MQW) structure positioned on the n-type cladding layer 13, a p-type AlGaN cladding layer 15 positioned on the light-emitting layer 14, a p-type GaN contact layer 16 positioned on the p-type cladding layer 15, and an n$^+$-type InGaN reverse-tunneling layer 20 positioned on the p-type contact layer 16.

Since sapphire is dielectric, a portion of the stacked structure of the LED has to be etched, exposing a portion of the n$^+$-type contact layer 12. Following this, an ITO layer is formed on the exposed surface of the LED. A photolithographic process is then used to form a p-type transparent ohmic contact electrode 17 on the n$^+$-type reverse-tunneling layer 20, and form an n-type transparent ohmic contact electrode 19 on the exposed portion of the n$^+$-type contact layer 12, respectively.

In a better embodiment of the present invention, the n$^+$-type reverse-tunneling layer 20 has a high carrier concentration of approximately $1.5 \times 10^{20}$ cm$^{-3}$, a thickness of approximately 20 angstroms, and provides high transparency. The p-n junction between the reverse-tunneling layer 20 and the contact layer 16, and the p-n junction between the cladding layers 15 and 13 must be in opposite bias conditions to induce electron tunneling through the reverse-tunneling layer 20 according to a tunneling effect. For example, when p-n junction between the reverse-tunneling layer 20 and the contact layer 16 is in a forward bias condition, the p-n junction between the cladding layers 15 and 13 must be in a reverse bias condition. Alternatively, when the p-n junction between the reverse-tunneling layer 20 and the contact layer 16 is in a reverse bias condition, the p-n junction between the cladding layers 15 and 13 must be in a forward bias condition.

In addition, in other embodiments of the present invention, the multiple-quantum well structure for the InGaN light-emitting layer 14 can be replaced with a single-quantum well structure. The GaN buffer layer 11 and/or the p-type contact layer 16 can be optional to be removed from the LED structure. The n+-type GaN contact layer 12 can be replaced by an n-type GaN layer.

In contrast to the prior art, the p-type transparent ohmic contact electrode 17 and the n-type transparent ohmic contact electrode 19 of the LED of the present invention are made of the same materials, such as ITO, CTO or TiWN. Therefore, the manufacturing procedures of LEDs are simplified, and the production costs are effectively reduced according to the present invention.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A light emitting diode comprising:
   an insulating substrate;
   a semiconductor stack positioned over the insulating substrate, the semiconductor stack comprising a first surface and a second surface, a distance between the first surface and the insulating substrate is greater than a distance between the second surface and the insulating substrate;

a reverse-tunneling layer over the first surface, the reverse-tunneling layer being a gallium nitride (GaN) based semiconductor;

a first transparent ohmic contact electrode positioned directly on the reverse-tunneling layer, the first transparent ohmic contact electrode comprising an oxide; and a second transparent ohmic contact electrode positioned over the second surface.

2. The light emitting diode of claim 1, wherein the insulating substrate comprises sapphire, and the first transparent ohmic contact electrode and the second transparent ohmic contact electrode comprise the same non-metal material.

3. The light emitting diode of claim 1, wherein the first transparent ohmic contact electrode or the second transparent ohmic contact electrode comprises at least one selected from a group comprising indium tin oxide (ITO) and cadmium tin oxide (CTO).

4. A light emitting diode comprising:

an insulating substrate;

a buffer layer positioned on the insulating substrate;

an $n^+$-type contact layer positioned on the buffer layer, the contact layer comprising a first surface and a second surface;

an n-type cladding layer positioned on the first surface of the $n^+$-type contact layer;

a light-emitting layer positioned on the n-type cladding layer;

a p-type cladding layer positioned on the light-emitting layer;

a p-type contact layer positioned on the p-type cladding layer;

an $n^+$-type reverse-tunneling layer positioned on the p-type contact layer;

a p-type transparent ohmic contact electrode positioned on the $n^+$-type reverse-tunneling layer; and an n-type transparent ohmic contact electrode positioned on the second surface of the $n^+$-type contact layer;

wherein the p-type transparent ohmic contact electrode and the n-type transparent ohmic contact electrode comprise the same materials.

5. The light emitting diode of claim 4, wherein the insulating substrate comprises sapphire.

6. The light emitting diode of claim 4, wherein the p-type transparent ohmic contact electrode and the n-type transparent ohmic contact electrode are made of at least one selected from a group comprising indium tin oxide and cadmium tin oxide.

7. A light emitting diode comprising:

an insulating substrate;

a semiconductor light emitting stack positioned over the insulating substrate, the semiconductor light emitting stack comprising a first surface and a second surface, a distance between the first surface and the insulating substrate is greater than a distance between the second surface and the insulating substrate;

a reverse-tunneling layer over the first surface, the reverse-tunneling layer being a gallium nitride (GaN) based semiconductor;

a first non-metal transparent ohmic contact electrode positioned over the reverse-tunneling layer; and a second non-metal transparent ohmic contact electrode positioned over the second surface, wherein the first non-metal transparent ohmic contact electrode and the second non-metal transparent ohmic contact electrode comprise the same oxide material.

8. The light emitting diode of claim 7, wherein the first non-metal transparent ohmic contact electrode and the second non-metal transparent ohmic contact electrode comprise at least one selected from a group comprising indium tin oxide (ITO) and cadmium tin oxide (CTO).

9. A light emitting diode comprising:

an insulating substrate;

a semiconductor stack positioned over the insulating substrate, the semiconductor stack comprising a first surface and a second surface, a distance between the first surface and the insulating substrate is greater than a distance between the second surface and the insulating substrate;

a reverse-tunneling layer, which is a gallium nitride (GaN) based semiconductor that has a carrier concentration of approximately $1.5 \times 10^{20}$ cm$^{-3}$, over the first surface;

a first transparent ohmic contact electrode directly on the reverse-tunneling layer, the first transparent ohmic contact electrode comprising an oxide; and a second transparent ohmic contact electrode over the second surface.

10. The light emitting diode of claim 9, wherein the reverse-tunneling layer has a thickness of approximately 20 angstroms.

11. A light emitting diode comprising:

an insulating substrate;

a semiconductor stack positioned over the insulating substrate, the semiconductor stack comprising a first surface and a second surface, a distance between the first surface and the insulating substrate is greater than a distance between the second surface and the insulating substrate;

a reverse-tunneling layer over the first surface, the reverse-tunneling layer being a gallium nitride (GaN) based semiconductor; and a first transparent ohmic contact electrode directly on the reverse-tunneling layer, the first transparent ohmic contact electrode comprising an oxide.

12. A light emitting diode comprising:

an insulating substrate;

a buffer layer positioned on the insulating substrate;

an n-type contact layer positioned on the buffer layer, the contact layer comprising a first surface and a second surface;

an n-type cladding layer positioned on the first surface of the n-type contact layer;

a light-emitting layer positioned on the n-type cladding layer;

a p-type cladding layer positioned on the light-emitting layer;

a p-type contact layer positioned on the p-type cladding layer;

an $n^+$-type reverse-tunneling layer positioned on the p-type contact layer;

a p-type transparent ohmic contact electrode positioned on the $n^+$-type reverse-tunneling layer; and an n-type transparent ohmic contact electrode positioned on the second surface of the n$^+$-type contact layer;

wherein the p-type transparent ohmic contact electrode and the n-type transparent ohmic contact electrode comprise the same materials.

13. The light emitting diode of claim 12, wherein the insulating substrate comprises sapphire.

14. The light emitting diode of claim 12, wherein the p-type transparent ohmic contact electrode and the n-type transparent ohmic contact electrode are made of at least one selected from a group comprising indium tin oxide and cadmium tin oxide.

* * * * *